(12) United States Patent
Kusko et al.

(10) Patent No.: US 7,882,454 B2
(45) Date of Patent: Feb. 1, 2011

(54) APPARATUS AND METHOD FOR IMPROVED TEST CONTROLLABILITY AND OBSERVABILITY OF RANDOM RESISTANT LOGIC

(75) Inventors: Mary P Kusko, Hopewell Junction, NY (US); Haoxing Ren, Austin, TX (US); Ronald G Walther, Austin, TX (US); Rona Yaari, New York, NY (US)

(73) Assignee: International Business Machines Corporation, Armonk, NY (US)

(*) Notice: Subject to any disclaimer, the term of this patent is extended or adjusted under 35 U.S.C. 154(b) by 431 days.

(21) Appl. No.: 12/110,731

(22) Filed: Apr. 28, 2008

(65) Prior Publication Data

US 2009/0271671 A1 Oct. 29, 2009

(51) Int. Cl.
*G06F 17/50* (2006.01)
(52) U.S. Cl. .......................................... 716/1
(58) Field of Classification Search ....................... 716/1
See application file for complete search history.

(56) References Cited

U.S. PATENT DOCUMENTS

| 5,450,414 | A | | 9/1995 | Lin |
| 5,812,561 | A | * | 9/1998 | Giles et al. ................ 714/726 |
| 6,038,691 | A | | 3/2000 | Nakao et al. |
| 6,301,688 | B1 | | 10/2001 | Roy |
| 6,745,373 | B2 | | 6/2004 | Lackey |
| 6,782,515 | B2 | | 8/2004 | Scott et al. |
| 6,865,723 | B2 | | 3/2005 | Lackey |
| 7,051,302 | B2 | | 5/2006 | Xiang et al. |
| 7,131,081 | B2 | | 10/2006 | Wang et al. |
| 7,530,033 | B2 | * | 5/2009 | Caldwell et al. ................ 716/1 |
| 2005/0125753 | A1 | * | 6/2005 | Vandling .................... 716/5 |

OTHER PUBLICATIONS

Kedarnath J. Balakrishnan, Transition Test Volume Reduction Using Test Point Insertion At RTL, SouthWest DFT Conference, May 30-31, 2007.

Rajamani Sethuram et al., Zero Cost Test Point Insertion Technique To Reduce Test Set Size and Test Generation Time for Structured ASICs, 15th Asian Test Symposium, Apr. 2006, IEEE, NEC Laboratories America, Princeton, NJ USA.

(Continued)

*Primary Examiner*—Cheryl Lewis
(74) *Attorney, Agent, or Firm*—Cantor Colburn LLP; Daniel Schnurmann

(57) ABSTRACT

A method for implementing improved observability of random resistant logic included in an integrated circuit (IC) design includes configuring a multiplexer device to pass, to a preexisting storage latch within the design, one of: a signal from one or more observation points within the random resistant logic and an output of first preexisting combinational logic; and selecting a preexisting net within the IC design to generate a randomized logic signal that, in a test mode, is passed to the multiplexer device to serve as a control signal thereto; wherein, in the test mode, the existing storage latch captures data randomly selected from either the existing combinational logic and the one or more observation points and in a normal mode, the existing storage latch captures data from only the existing combinational logic, facilitating random testing of the random resistant logic in a manner that avoids adding latches to the design.

20 Claims, 7 Drawing Sheets

OTHER PUBLICATIONS

Nur A. Touba et al., Test Point Insertion Based on Path Tracing, 14th VLSI Test Symposium, 1996, IEEE, pp. 8, Center for Reliable Computing, Stanford University, Stanford, CA USA.

Harald Vraken et al., Impact Of Test Point Insertion On Silicon Area And Timing During Layout, Proceedings of the Design, Automation and Test in Europe Conference and Exhibition, 2004, IEEE.

Chih-Chang Lin et al., Test Point Insertion: Scan Paths Through Functional Logic, IEEE Transactions on Computer-Aided Design of Integrated Circuits And Systems, Sep. 1998, pp. 838-851, vol. 17, No. 9.

E.B. Eichelberger et al., Random-Pattern Coverage Enhancement And Diagnosis for LSSD Logic Self-Test, IBM J. Res. Develop., May 1983, pp. 265-272, vol. 27, No. 3, USA.

Seongmoon Wang et al., A Scalable Scan-Path Test Point Insertion Technique To Enhance Delay Fault Coverage For Standard Scan Designs, ITC International Test Conference, 2003, pp. 574-583, NEC Labs., America, Princeton, NJ USA, IEEE.

* cited by examiner

APPARATUS AND METHOD FOR IMPROVED TEST CONTROLLABILITY AND OBSERVABILITY OF RANDOM RESISTANT LOGIC

BACKGROUND

The present invention relates generally to integrated circuit (IC) device testing techniques and, more particularly, to an apparatus and method for implementing improved test controllability and observability of random resistant logic.

The testing of integrated circuits has evolved into a highly developed area of technology. Generally, such testing may be implemented through the use of external equipment, Built-In Self-Test (BIST) circuitry, or a combination of the two. Typically, all test methodologies involve shifting data into scannable memory elements of an integrated circuit device (e.g., Level Sensitive Scan Design or LSSD latches), capturing the input to the memory elements, shifting the captured data out and then comparing the captured data with predetermined values to determine whether the circuit has performed according to design. Automatic test pattern generation (ATPG) systems use tools for testing digital circuits after the circuits have been manufactured. In general, an ATPG tool generates a set of test vectors that are applied to a circuit under test. The output of the circuit is analyzed to identify logic faults in the circuit design (i.e., "functional testing"), as well as detecting fabrication defects (i.e., "structural testing").

Although it is desirable when testing the logic circuitry to use deterministic testing by checking the circuit output response to all $2^n$ possible input permutations, this approach becomes impractical as the number of input variables n and the size of the pattern set increases. Thus, a related technique, referred to as pseudo-random testing, is employed when the number of input variables is so large that it becomes impractical to use an exhaustive testing approach. Pseudo-random testing is an alternative technique that generates test patterns in a random fashion from the $2^n$ possible patterns. In this approach, fewer than all of the $2^n$ patterns are tested. Because of the relatively low hardware overhead and the simplicity of test pattern generation, pseudo-random testing is a preferred technique for BIST. Practical circuits, however, often contain random pattern resistant faults which result in unacceptable low fault coverages and low circuit excitation for a reasonable test length.

Test patterns are typically graded against a fault model (e.g., the stuck-at-fault model). With pseudo-random data, certain random resistant structures are difficult to test. One example of such a "random pattern resistant" or "random resistant" logic circuit is a compare circuit that compares the contents of a first register to the contents of a second register. Because the sizes of the registers to be compared can be several bits in length (e.g., 24 bits or even 80 bits or more), it is virtually assured from a statistical standpoint that the random bits generated and loaded into the first register will not exactly match the random bits generated and loaded into the second register. Thus, the compare circuit will almost always be tested in a mismatch condition with a conventional scan chain-based BIST design, even though a test of a match condition is equally (if not more) important. In addition, a "near match" condition (e.g., where only 1 of 24 bits is mismatched) is also desired test condition. Again, however, the statistical probabilities associated with achieving such a randomly generated data type make random pattern testing of this nature problematic at best. Because compare logic is often found in the most critical of timing paths in IC designs, the quality testing of such logic structures (so as to enable the detection of small delay defects) is a significant concern.

A known technique in Design for Test (DFT) methodology is to run an analysis tool that identifies random resistant logic. In this regard, there are several commercially available products that perform this function. The output of such random resistant analysis tools is a list of recommended test points, at which a latch or other type of memory element (e.g., flip-flop) is to be added to the design in order to serve as either a control point or an observation point. Some tools may actually insert the recommended structure at the control/observation point for the user. Although the additional hardware addresses a testability problem, it also impacts the circuit design in several ways, such as with respect to timing, power consumption and device area, for example.

While other methods exist for understanding and addressing the random testability of circuit designs, in the end such solutions ultimately involve adding latches or, at a minimum, are restricted to using a latch output as a control point. It is recognized that the input and output pins of a chip may, in theory, be used as observation points, but this quickly becomes impractical given the number of test points and the limited availability of chip input/output (I/O). As a practical matter, therefore, the choice of control or observation points is essentially limited to the input or output of a latch.

Modifications to a circuit design that add control/observation latches are implemented late in the design stage such that the latches and fan-in/fan-out connections are not implement in the most efficient manner. Either more latches are added than are necessary, or a solution is implemented which adds unnecessary delay or which adversely affects the design. In certain cases, no changes are made, thereby resulting in a design with reduced random testability where the penalty for adding one or more latches is too great (e.g., unacceptable timing). Accordingly, it would be desirable to be able to improve the random testability of circuit designs, but in a manner that minimizes adverse impacts to the circuit design, such as those described above.

SUMMARY

The foregoing discussed drawbacks and deficiencies of the prior art are overcome or alleviated, in an exemplary embodiment, by a method for implementing improved observability of random resistant logic included in an integrated circuit (IC) design, including configuring a multiplexer device to pass, to a preexisting storage latch within the IC design, a selected one of: a signal from one or more observation points within the random resistant logic and an output of first preexisting combinational logic; and selecting a preexisting net within the IC design to generate a randomized logic signal that, in a test mode of operation, is passed to the multiplexer device to serve as a control signal thereto; wherein, in the test mode of operation, the existing storage latch captures data randomly selected from either the existing combinational logic and the one or more observation points and in a normal mode of operation, the existing storage latch captures data from only the existing combinational logic, thereby facilitating random testing of the random resistant logic in a manner that avoids adding latch devices to the IC design.

In another embodiment, an apparatus for implementing improved observability of random resistant logic included in an integrated circuit (IC) design includes a multiplexer device configured to pass, to a preexisting storage latch within the IC design, a selected one of: a signal from one or more observation points within the random resistant logic and an output of first preexisting combinational logic; and a preexisting net within the IC design selected to generate a randomized logic signal that, in a test mode of operation, is passed to the multiplexer device to serve as a control signal thereto; wherein, in the test mode of operation, the existing storage latch captures data randomly selected from either the existing combinational logic and the one or more observation points and in a normal mode of operation, the existing storage latch captures data from only the existing combinational logic, thereby facilitating random testing of the random resistant logic in a manner that avoids adding latch devices to the IC design.

In still another embodiment, a method for implementing improved controllability of random resistant logic included in an integrated circuit (IC) design includes selecting one or more preexisting nets within the IC design to serve as control points with respect to the random resistant logic, wherein the selection of the one or more preexisting nets is based on one or more of: proximity to the random resistant logic and a defined timing margin with respect to testing speed of the random resistant logic; and configuring first combinational logic to selectively pass, through a test enable signal, corresponding logic signals from the one or more preexisting nets to second combinational logic configured within the random resistant logic, thereby facilitating random testing of the random resistant logic.

In still another embodiment, an apparatus for implementing improved controllability of random resistant logic included in an integrated circuit (IC) design, includes first combinational logic configured to selectively pass, through a test enable signal, corresponding logic signals from one or more preexisting nets within the IC design to second combinational logic configured within the random resistant logic, with the one or more preexisting nets selected to serve as control points with respect to the random resistant logic; wherein the location of the one or more preexisting nets is based on one or more of: proximity to the random resistant logic and a defined timing margin with respect to testing speed of the random resistant logic, and wherein the selected preexisting nets, the first combinational logic and the second combinational logic facilitate random testing of the random resistant logic.

BRIEF DESCRIPTION OF THE DRAWINGS

Referring to the exemplary drawings wherein like elements are numbered alike in the several Figures.

DETAILED DESCRIPTION

Disclosed herein is an apparatus and method for implementing improved controllability and observability of random resistant logic. Briefly stated, the embodiments herein utilize existing tap points (nets) within a circuit design to provide control stimulus points and/or observation points for random resistant logic. As indicated above, traditional control points have been realized through adding latches or through direct outputs to latches. Traditional observation points have been realized through the addition of latches. In contrast, the present embodiments use a preexisting net selected to minimize design impact, as well as taking advantage of natural weighting (signal probability) in the design itself.

Figure 1:
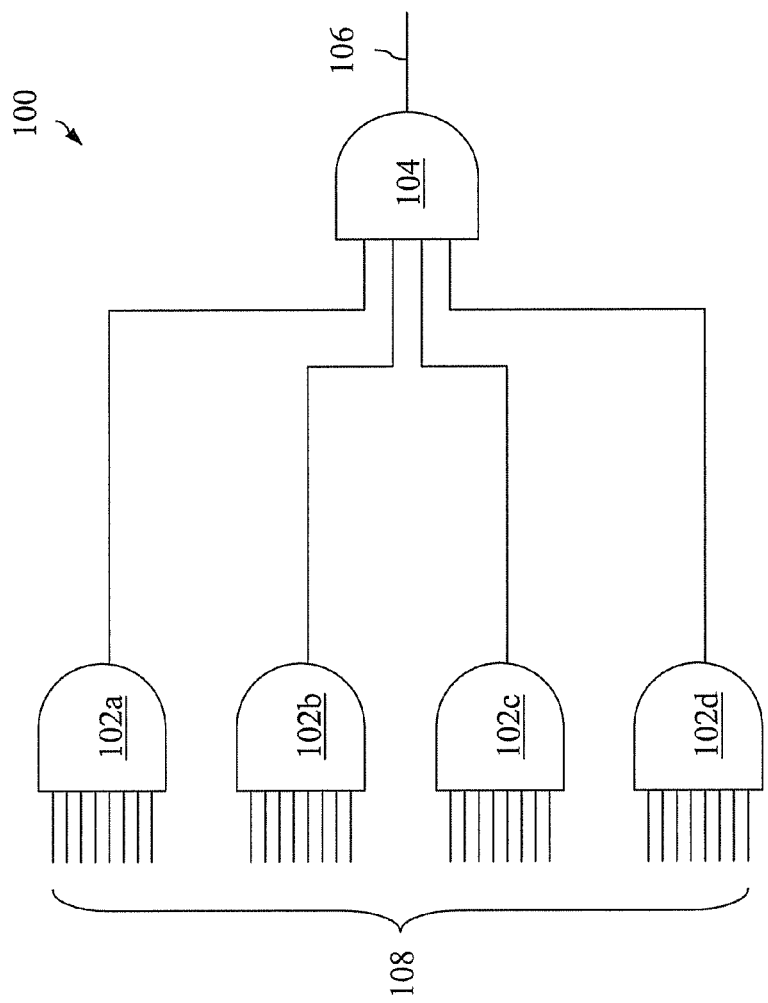
FIG. 1 is a schematic diagram of an exemplary random resistant logic structure included within an IC device design.

Referring initially to FIG. 1, there is shown a schematic diagram of an exemplary random resistant logic structure 100 included within an IC device design. In this particular example, the random resistant logic structure 100 is a 32-input AND gate that, as a practical matter, is implemented with a first stage of four, 8-input AND gates 102$a$, 102$b$, 102$c$, 102$d$. The outputs of the 8-input AND gates are then input to a second stage, which is a 4-input AND gate 104. The output 106 of AND gate 104 thus represents the AND function output of the 32 inputs, collectively designated by 108. From a random pattern testing perspective, it will be come evident that logic structure 100 is a random resistant structure since output 106 will only be a logical 1 in the event that each and every one of the 32 inputs 108 are also a logical 1. With this many inputs, there is only a 1 in $2^{32}$ chance that a random input pattern will generate a logical 1 on the output 106 of the logic structure 100.

It should be noted at this point that although the random resistant logic is depicted in FIG. 1 (as well as inventive embodiments described hereinafter) as a "wide" AND gate, many other types of logic resistant to random testing are also contemplated as being applicable to the principles disclosed herein.

Figure 2:
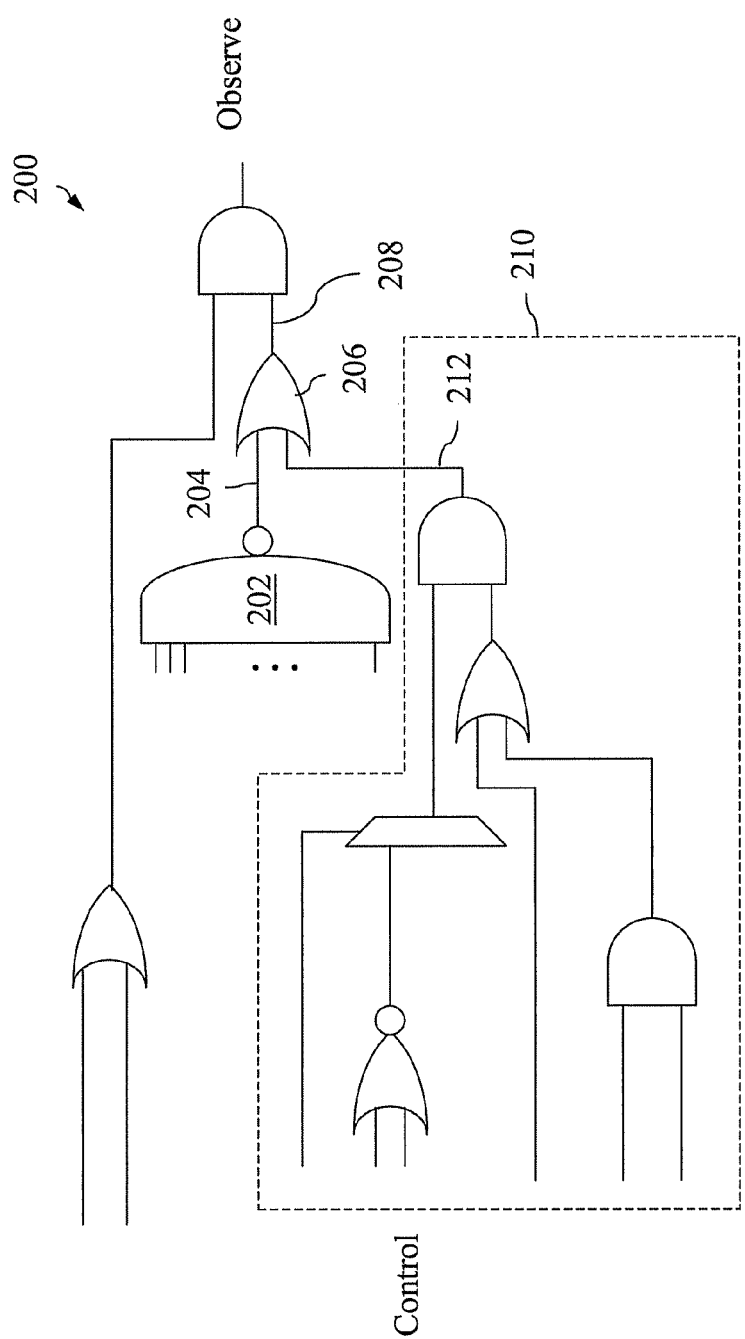
FIG. 2 is a schematic diagram of another logic structure wherein a portion random resistant logic included therein effectively blocks the random testability of a substantial portion of the rest of the logic.

FIG. 2 is a schematic diagram of another logic structure 200 wherein random resistant logic included therein effectively blocks the random testability of a substantial portion of the rest of the logic. More specifically, the random resistant logic 202 of logic structure 200 is a negative AND (NAND) gate, of a similar type to that shown in FIG. 1. For example, the 32-input NAND gate 202 is resistant to producing an output of logic 0, unless each of the 32 inputs randomly happen to be logic 1. This is an extremely unlikely condition from a probability standpoint. Moreover, since the output 204 of NAND gate 202 is coupled to a 2-input OR gate 206, then the output 208 of the OR gate 206 will always be logical 1, unless the unlikely random combination of 32 1's are generated at the inputs of NAND gate 202. As a result, the practical elimination of a random 0 as a first input to the OR gate 206 effectively blocks random testing of all of the other logic within the dashed line 210, since the output 212 thereof represents the second input to the OR gate 206.

Figure 3:
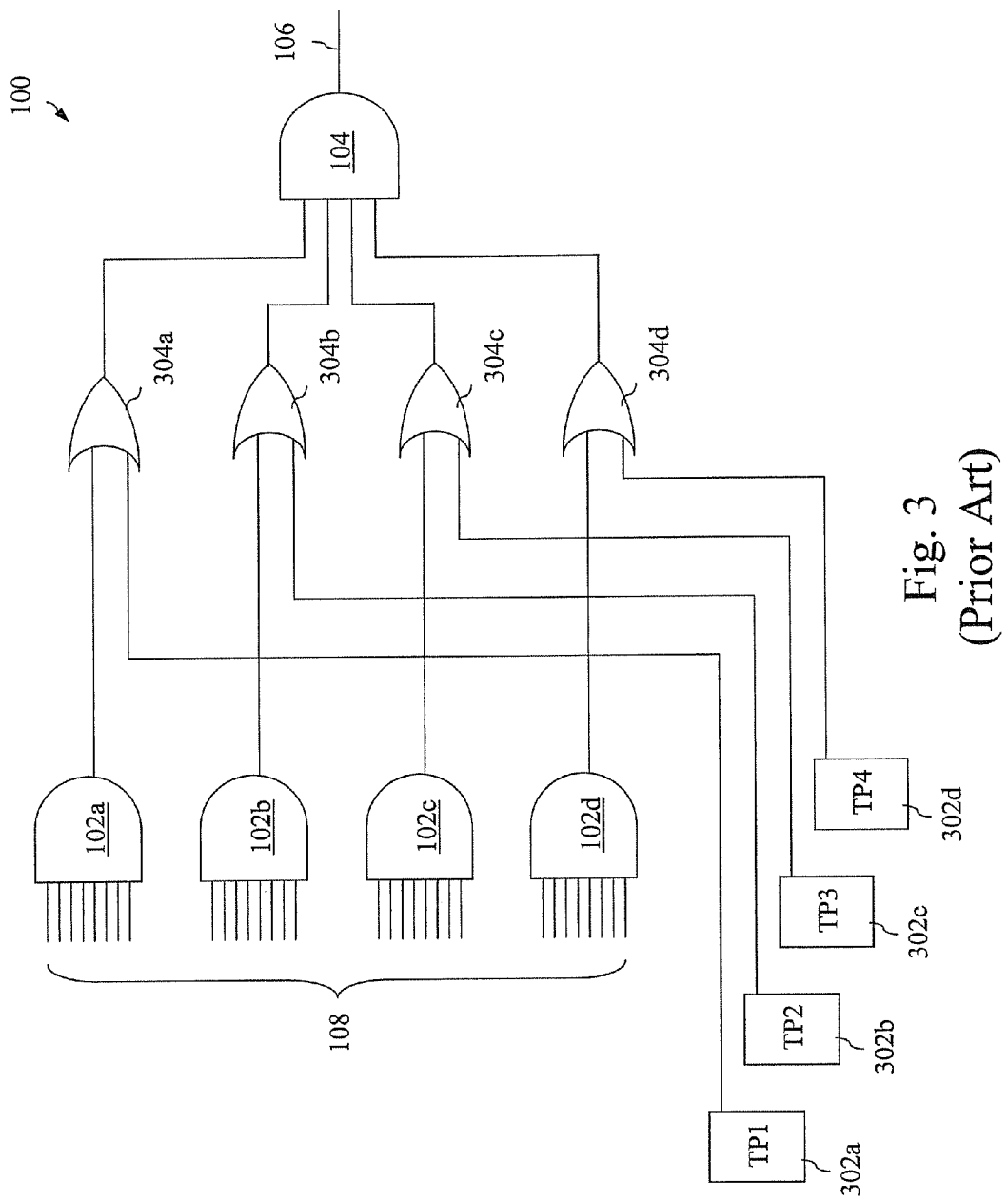
FIG. 3 is a schematic diagram illustrating a conventional manner of establishing control points for testing of the random resistant logic structure shown in FIG. 1.

Accordingly, FIG. 3 is a schematic diagram illustrating a conventional manner of establishing control points for testing of the random resistant logic structure 100 shown in FIG. 1. As is shown, a plurality of scannable latches 302$a$, 302$b$, 302$c$, 302$d$ (also labeled TP1-TP4 in FIG. 3) are added to the design, as well a corresponding plurality of OR gates 302$a$, 302$b$, 302$c$, 302$d$ configured between the first stage of AND gates 102*a*, 102*b*, 102*c*, 102*d* and the second stage AND gate 104. In so doing, the output 106 can be randomly tested for a logical 1 in the event that the outputs of the four latches TP1 through TP4 are all logical 1. Where the output of each latch has a 50/50 probability of being a logical 1, then there is a 1 in 16 chance of testing for a logical 1 output of the AND gate 104, as opposed to a 1 in $2^{32}$ chance. When not operating in a test mode, the outputs of latches TP1-TP4 can be forced to 0 so as to effectively render the OR gates 302*a*, 302*b*, 302*c*, 302*d* transparent to logic 100.

Figure 4:
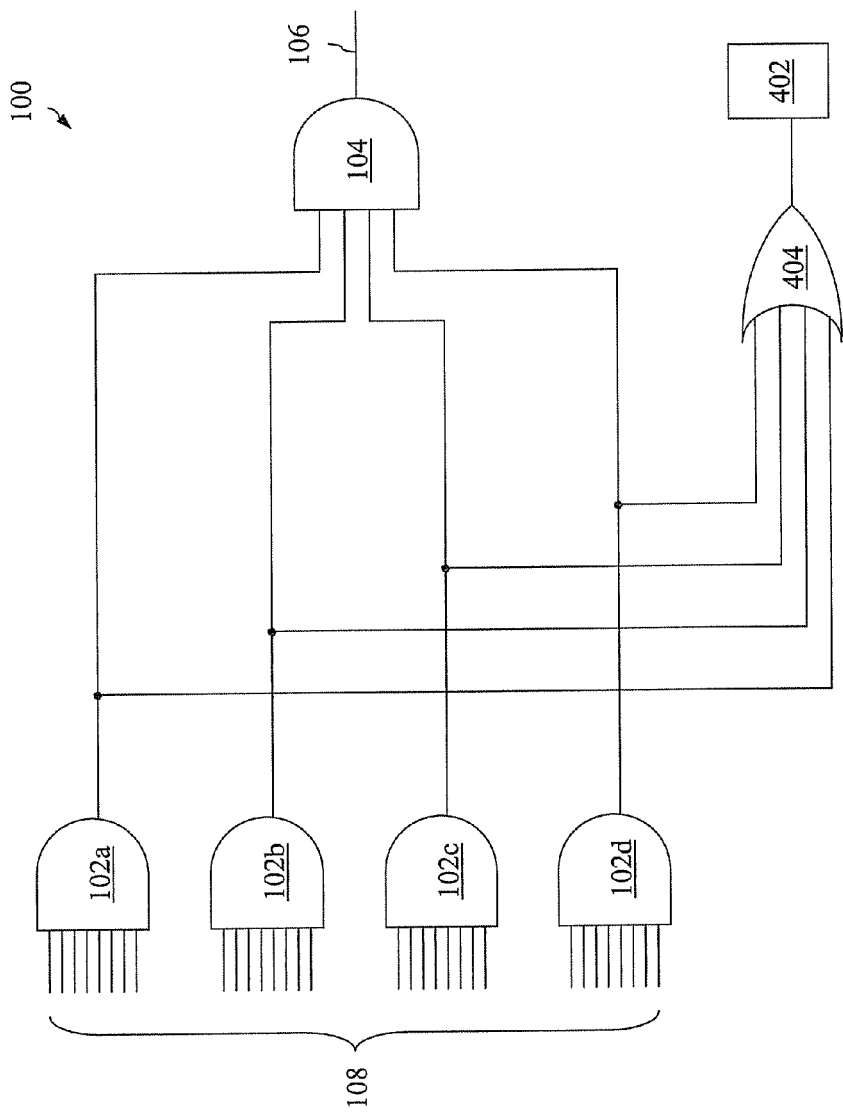
FIG. 4 is a schematic diagram illustrating a conventional manner of establishing observation points for testing of the random resistant logic structure shown in FIG. 1.

However, as also indicated above, the use of additional storage latches as control points in an inefficient solution, in terms of both device area and power consumption. This is also the case from an observation standpoint, as shown in FIG. 4. More specifically, FIG. 4 is a schematic diagram illustrating a conventional manner of establishing observation points for testing of the random resistant logic structure 100 shown in FIG. 1. As is shown, a scannable latch 402 is added to the design, as well a 4-input OR gate 404 that samples the outputs of the first stage of AND gates 102*a*, 102*b*, 102*c*, 102*d*. The output of the OR gate 404 is fed to the latch 402. In so doing, the value stored in the latch 402 can be observed to see whether at least one of the four inputs to second stage AND gate 104 is logical 1.

Alternatively, for additional observational capability, the OR gate 404 could be eliminated and four latches could be used, each one dedicated to an individual output of AND gates 102*a*, 102*b*, 102*c*, 102*d*. Unfortunately, the use of added test point latches for observation (such as single latch 402 or a separate latch for each AND gate 102*a*, 102*b*, 102*c*, 102*d*) typically requires full functional clocking for at-speed testing, which again results in additional area and power consumption.

Figure 5:
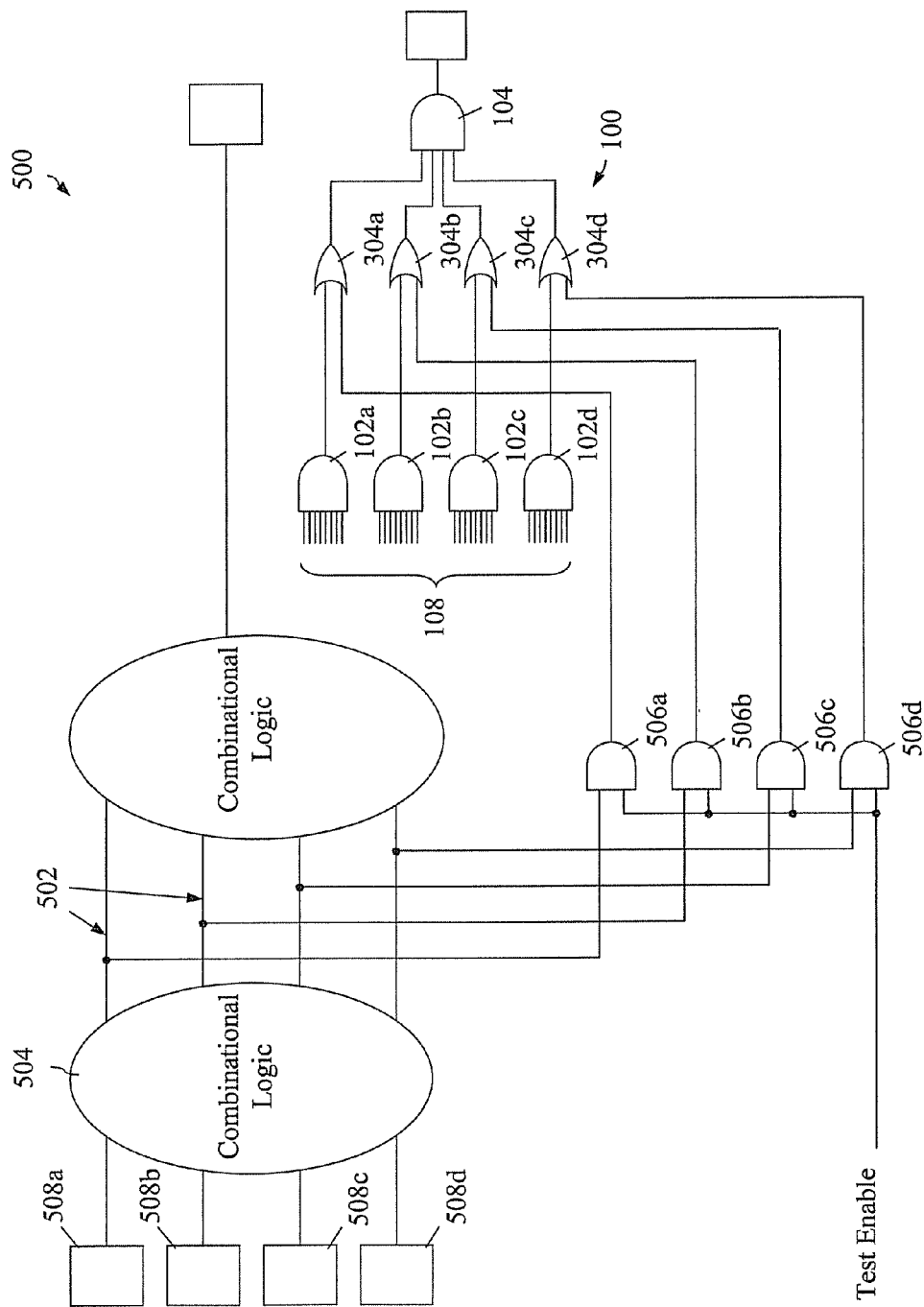
FIG. 5 is a schematic diagram of an apparatus for implementing improved test controllability of random resistant logic, in accordance with an embodiment of the invention.

Accordingly, FIG. 5 is a schematic diagram of an apparatus 500 for implementing improved test controllability of random resistant logic, in accordance with an embodiment of the invention. In the exemplary embodiment of FIG. 5, preexisting circuit nets 502 associated with outputs of preexisting logic 504 are used as control points for random testing of the random resistant logic 100. Thus, in lieu of a latch input or output of specially added test latches, the preexisting nets 502 are selected to as to minimize design impact and timing margins by, for example, comprising wiring that is physically close to the random resistant logic 100 or by tapping off nets based on a defined timing margin with respect to testing speed of the random resistant logic 100. As a result, the added devices need only come in the form of combinational logic, such as AND gates 502*a*, 502*b*, 502*c*, 502*d*. It will be noted that in selecting specific preexisting net locations for use as control points, the selected next should not feed into the Boolean operation of a cone of logic of the random resistant logic to be tested. For example, preexisting nets 502 of FIG. 5 do not logically feed the inputs 108 of the random resistant logic 100.

In operation, an activated test enable signal passes the values of the signals on the nets 502 through AND gates 502*a*, 502*b*, 502*c*, 502*d* to the second input of OR gates 304*a*, 304*b*, 304*c*, 304*d*. As the values of the signals on the nets 502 are effectively random, this has the same functionality as dedicated additional latch outputs to the OR gates 304*a*, 304*b*, 304*c*, 304*d*, in that there is now a 1 in 16 probability of testing for a logical 1 output on AND gate 104. In a non-testing mode, the test enable signal is deactivated so as to set each of the second inputs of the OR gates 304*a*, 304*b*, 304*c*, 304*d* to logic 0, thereby rendering the OR gates 304*a*, 304*b*, 304*c*, 304*d* transparent to the operation of logic 100. Moreover, the test enable signal may be taken from an existing test signal associated with the circuit design itself.

Depending upon the polarity of the test enable signal, it will also be appreciated that, in lieu of AND gates 502*a*, 502*b*, 502*c*, 502*d*, OR gates could also be used to carry out the same functionality.

It will also be noted that, in addition to various combinational logic outputs, the preexisting net locations can also correspond to outputs of existing circuit latches, such as latches 508*a*, 508*b*, 508*c*, 508*d*. On the other hand, such existing latch locations may not represent optimal locations from a timing standpoint and typically would be 50% weighted logic). With respect to signal probabilities, the preexisting nets can be chosen such that they have natural weights or equal probabilities of the signal being a 1 or a 0. Alternatively, nets can be chosen in accordance with a desired probability weight of achieving a certain signal value to in turn increase the probability of generating a desired random pattern.

Figure 6:
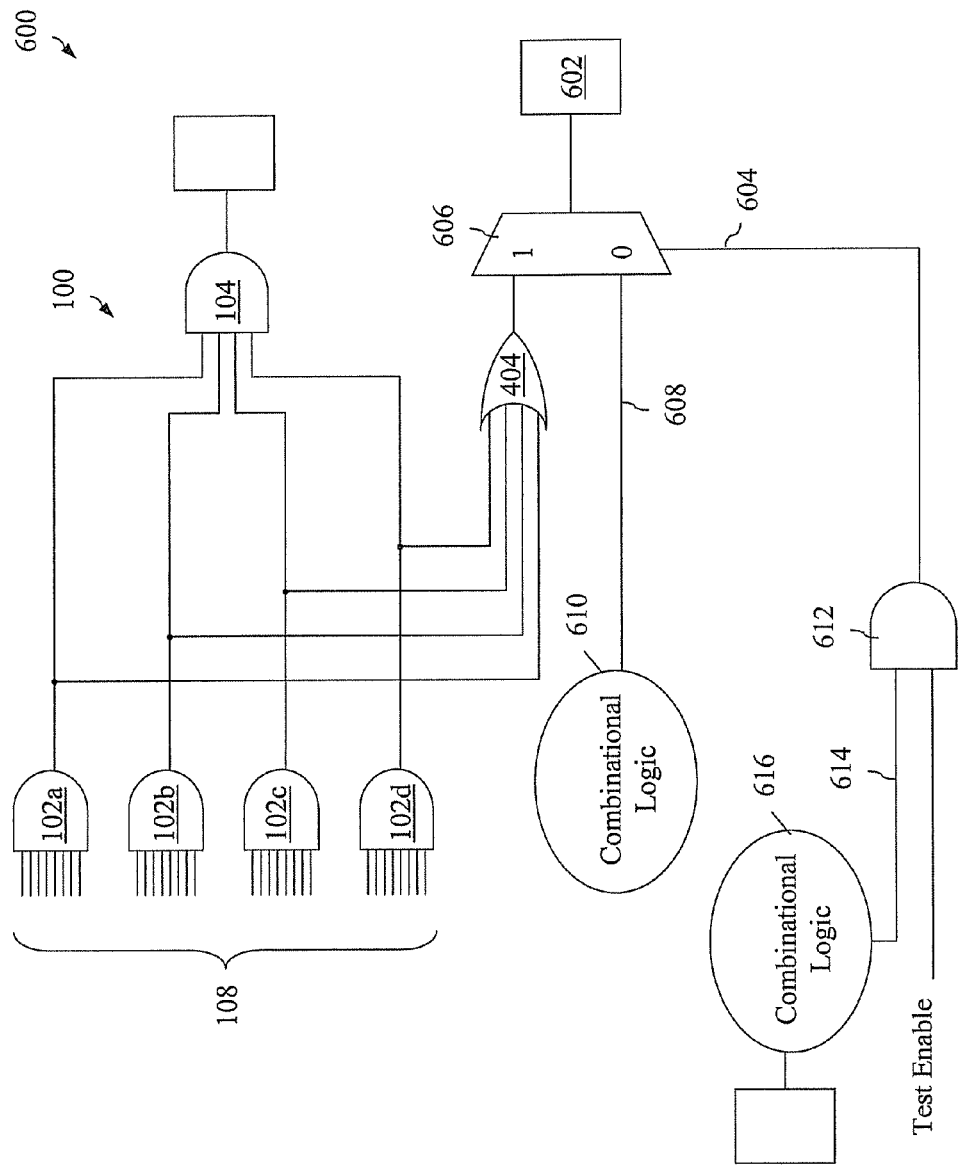
FIG. 6 is a schematic diagram of an apparatus for implementing improved test observability of random resistant logic, in accordance with a further embodiment of the invention.

From an observation perspective, FIG. 6 is a schematic diagram of an apparatus 600 for implementing improved test observability of random resistant logic, in accordance with an alternative embodiment of the invention. In the exemplary embodiment of FIG. 6, a preexisting circuit latch 602 is used as an observation point in the random testing of the random resistant logic 100. Depending on the state of an input signal 604 to a multiplexer 606, the latch 602 will capture either the state of the output 608 of existing combinational logic 610 or will capture the observed output of the OR gate 404. Again, the output of OR gate 404 is used to determine whether at least one of the four inputs to second stage AND gate 104 of random resistant logic 100 is logical 1.

Through the use of AND gate 612, a test enable signal, if deactivated, will ensure that the input signal 604 of the multiplexer 606 (i.e., the output of AND gate 612) is low, thus selecting the output 608 of combinational logic 610 for observation by existing latch 602. On the other hand, if the test enable signal is activated, the AND gate 612 passes a randomized (but known) output signal 614 of additional combinational logic 616 as the input signal 604 of the multiplexer 606. That is, depending on the random state of signal 614, the multiplexer 606 will cause the preexisting latch 602 to either observe the internal state of random resistant logic 100 or the state of the output 608 of combinational logic 610 in a test mode of operation. In so doing, signal 614 will randomly cause observation of either the random resistant logic 100 or the combinational logic 610, and thus the need for an additionally designed latch as an observation point is obviated.

Figure 7:
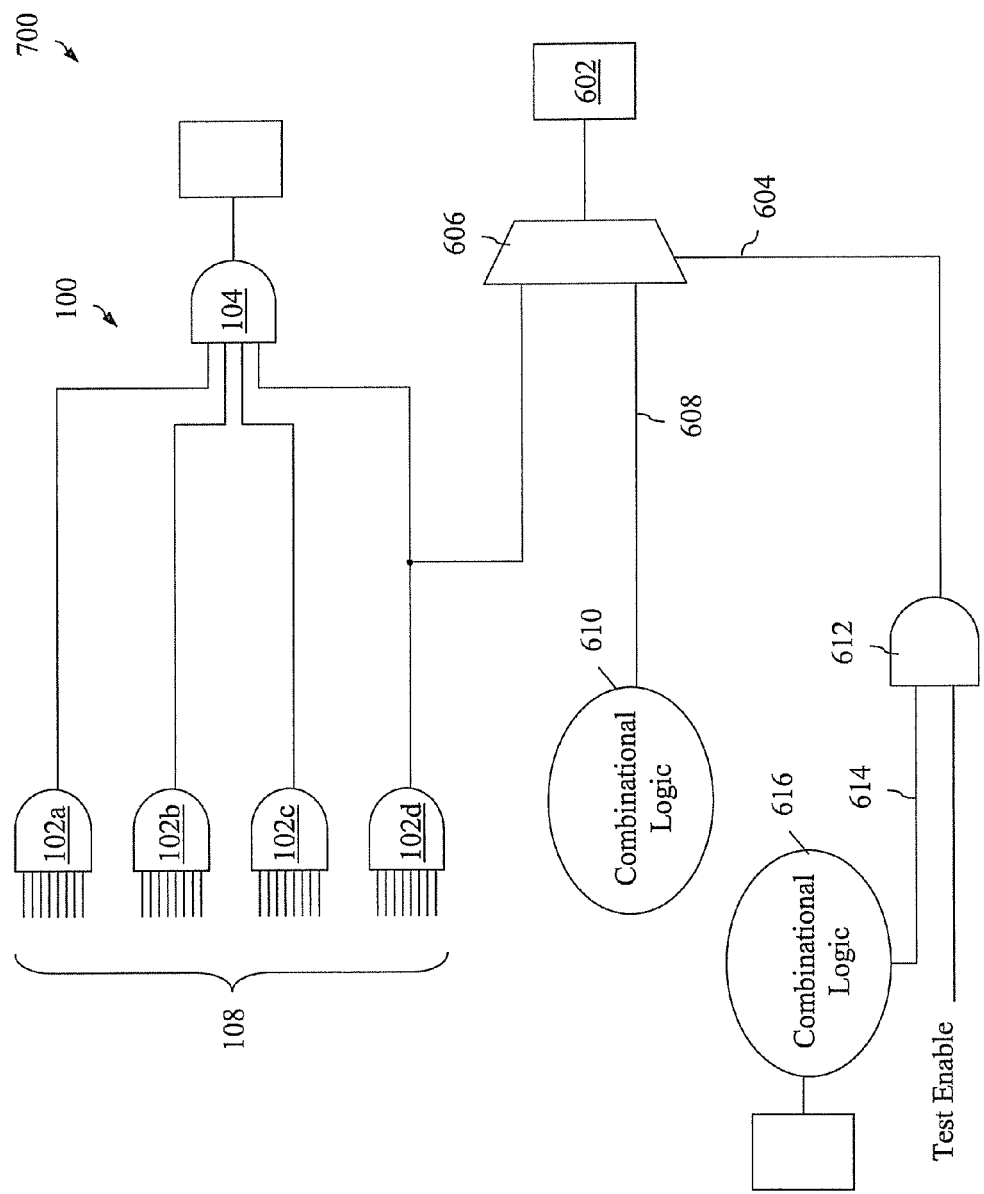
FIG. 7 is a schematic diagram of an apparatus for implementing improved test observability of random resistant logic, in accordance with still a further embodiment of the invention.

As is the case for control points, the preexisting net used for randomized signal 614 may have a 50/50 probability outcome or may also have a weighted probability. Also, as is the case for control points, both the preexisting observation latch 602 and the preexisting combinational logic 616 that produces the randomized output 614 are selected such that they are not part of the Boolean operation of the inputs 108 of a cone of logic of the random resistant logic 100. Finally, FIG. 7 is a schematic diagram of an apparatus 700 for implementing improved test observability of random resistant logic, in accordance with still an alternative embodiment of the invention. With respect to the apparatus 600 of FIG. 6, the apparatus FIG. 7 may be simplified by elimination the OR gate 404 and sampling a single one of the first stage AND gate outputs of gates 102*a*, 102*b*, 102*c*, 102*d*. However, multiplexer 606 is still used to observe the random resistant logic 100 whenever the test enable signal is activated (assuming that the signal on the tap point is also at logical 1). In addition, an exclusive OR (XOR) gate can be used in lieu of OR gate 404.

Although the exemplary embodiments described herein have presented examples of using preexisting nets for control and for observation, such features can be combined so as to use preexisting nets for both control and observation of random resistant logic. Moreover, such solutions presented herein are also supported by existing commercially available design automated software.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for implementing improved observability of random resistant logic included in an integrated circuit (IC) design, the method comprising:
   configuring a multiplexer device to pass, to a preexisting storage latch within the IC design, a selected one of: a signal from one or more observation points within the random resistant logic and an output of first preexisting combinational logic; and
   selecting a preexisting net within the IC design to generate a randomized logic signal that, in a test mode of operation, is passed to the multiplexer device to serve as a control signal thereto;
   wherein, in the test mode of operation, the existing storage latch captures data randomly selected from either the existing combinational logic and the one or more observation points and in a normal mode of operation, the existing storage latch captures data from only the existing combinational logic, thereby facilitating random testing of the random resistant logic in a manner that avoids adding latch devices to the IC design.

2. The method of claim 1, wherein signals from multiple observation points are coupled to one of: an OR gate and an exclusive OR (XOR) gate, an output of which represents one of the inputs of the multiplexer device.

3. The method of claim 1, wherein the preexisting net is selected from a location in the IC design that does not affect the Boolean operation of a cone of logic of the random resistant logic.

4. The method of claim 3, wherein the preexisting net is taken from an output of second preexisting combinational logic of the IC design.

5. The method of claim 3, wherein the preexisting net is chosen such that the corresponding logic signal taken therefrom has a desired probability weight of achieving a logical 1 or 0.

6. The method of claim 1, wherein the one or more preexisting nets are taken from outputs of preexisting combinational logic of the IC design.

7. The method of claim 1, wherein the one or more preexisting nets are chosen such that the corresponding logic signals taken therefrom have a desired probability weight of achieving a logical 1 or 0.

8. An apparatus for implementing improved observability of random resistant logic included in an integrated circuit (IC) design, comprising:
   a multiplexer device configured to pass, to a preexisting storage latch within the IC design, a selected one of: a signal from one or more observation points within the random resistant logic and an output of first preexisting combinational logic; and
   a preexisting net within the IC design selected to generate a randomized logic signal that, in a test mode of operation, is passed to the multiplexer device to serve as a control signal thereto;
   wherein, in the test mode of operation, the existing storage latch captures data randomly selected from either the existing combinational logic and the one or more observation points and in a normal mode of operation, the existing storage latch captures data from only the existing combinational logic, thereby facilitating random testing of the random resistant logic in a manner that avoids adding latch devices to the IC design.

9. The apparatus of claim 8, wherein signals from multiple observation points are coupled to one of: an OR gate and an exclusive OR (XOR) gate, an output of which represents one of the inputs of the multiplexer device.

10. The apparatus of claim 8, wherein the preexisting net is selected from a location in the IC design that does not affect the Boolean operation of a cone of logic of the random resistant logic.

11. The apparatus of claim 10, wherein the preexisting net is taken from an output of second preexisting combinational logic of the IC design.

12. The apparatus of claim 10, wherein the preexisting net is chosen such that the corresponding logic signal taken therefrom has a desired probability weight of achieving a logical 1 or 0.

13. A method for implementing improved controllability of random resistant logic included in an integrated circuit (IC) design, the method comprising:
   using a computer, selecting one or more preexisting nets within the IC design to serve as control points with respect to the random resistant logic, wherein the selection of the one or more preexisting nets is based on one or more of: proximity to the random resistant logic and a defined timing margin with respect to testing speed of the random resistant logic; and
   configuring first combinational logic to selectively pass, through a test enable signal, corresponding logic signals from the one or more preexisting nets to second combinational logic configured within the random resistant logic, thereby facilitating random testing of the random resistant logic.

14. The method of claim 13, wherein the first combinational logic comprises one of: an AND gate and an OR gate for each selected preexisting net.

15. The method of claim 13, wherein the one or more preexisting nets are selected from locations in the IC design that do not affect the Boolean operation of a cone of logic of the random resistant logic.

16. The method of claim 15, wherein the one or more preexisting nets are taken from outputs of preexisting combinational logic of the IC design.

17. The method of claim 15, wherein the one or more preexisting nets are chosen such that the corresponding logic signals taken therefrom have a desired probability weight of achieving a logical 1 or 0.

18. An apparatus for implementing improved controllability of random resistant logic included in an integrated circuit (IC) design, comprising:
   first combinational logic configured to selectively pass, through a test enable signal, corresponding logic signals from one or more preexisting nets within the IC design to second combinational logic configured within the random resistant logic, with the one or more preexisting nets selected to serve as control points with respect to the random resistant logic;

wherein the location of the one or more preexisting nets is based on one or more of: proximity to the random resistant logic and a defined timing margin with respect to testing speed of the random resistant logic, and wherein the selected preexisting nets, the first combinational logic and the second combinational logic facilitate random testing of the random resistant logic.

19. The apparatus of claim 18, wherein the first combinational logic comprises one of: an AND gate and an OR gate for each selected preexisting net.

20. The apparatus of claim 18, wherein the one or more preexisting nets are selected from locations in the IC design that do not affect the Boolean operation of a cone of logic of the random resistant logic.

* * * * *